United States Patent [19]

Nadd

[11] Patent Number: 4,994,886
[45] Date of Patent: Feb. 19, 1991

[54] COMPOSITE MOS TRANSISTOR AND APPLICATION TO A FREE-WHEEL DIODE

[75] Inventor: Bruno Nadd, Lourmarin Par Cadenet, France

[73] Assignee: SGS-Thomson Microelectronics S.A., Gentilly, France

[21] Appl. No.: 400,855

[22] Filed: Aug. 30, 1989

[30] Foreign Application Priority Data

Aug. 31, 1988 [FR] France .................. 88 11659

[51] Int. Cl.$^5$ .................. H01L 29/747; H01L 29/10; H01L 27/02
[52] U.S. Cl. .................. 357/41; 357/39; 357/42; 357/23.4
[58] Field of Search .................. 357/41, 42, 23.4, 39

[56] References Cited

U.S. PATENT DOCUMENTS 4,551,779  11/1985  Murakami et al. .................. 361/86

FOREIGN PATENT DOCUMENTS

0107137A1  10/1983  European Pat. Off. .

OTHER PUBLICATIONS

H. Matino; High voltage V-MosFet; Jul. 1977 IBM Technical Disclosure Bulletin; pp. 643-644.
Elektronik, vol. 37, No. 2, pp. 86-87, "Abschied von Externen Dioden".

Primary Examiner—Rolf Hille
Assistant Examiner—Wael Fahmi
Attorney, Agent, or Firm—Lowe, Price, Leblanc, Becker & Shur

[57]  ABSTRACT

A composite MOS transistor in a substrate of a first conductivity type comprises a gate electrode (G1), a first main electrode (A1) and a second main electrode (A2) in a substrate area (60). An auxiliary switch comprising MOS transistors (52, 53) in the substrate area, selectively provides a low impedance path between the substrate area and the lowest potential of the first and second main electrodes.

10 Claims, 4 Drawing Sheets

COMPOSITE MOS TRANSISTOR AND APPLICATION TO A FREE-WHEEL DIODE

BACKGROUND OF THE INVENTION

The invention relates to the field of semiconductors and more particularly to MOS transistors. It especially applies to power MOS transistors.

More particularly, the invention relates to a composite MOS transistor, the substrate of which is automatically connected to the lowest of the potentials applied to its two main electrodes (source and drain).

On the other hand, the invention relates to an application of the component according to the invention to a free-wheel diode structure, of the active diode type, that can be made in monolithic form on a chip also comprising a power MOS transistor of the vertical diffused MOS (VDMOS) type, or equivalent.

Before describing the invention, the problems encountered for implementing a free-wheel diode in technologies using vertical diffused MOS transistors and lateral logic MOS transistors on the same integrated circuit chip are described.

First, FIG. 1 shows the connection of a power switch 1 and a load 2 across a d.c. supply 3. Conventionally, in case load 2 is an inductive load, a diode 4, called free-wheeling diode, is connected in series with the power switch and in parallel with the load; this diode is designed to let the inductive current of the load flow when the switch is switched off, and is reverse biased with respect to the current flow direction when the main switch 1 is switched on. The free-wheel diode prevents substantial overvoltages when the main switch 1 in series with the load abruptly switches off.

The users of power switch generally wish to have this free-wheel diode 4 integrated in the same semiconductive chip as the power switch.

FIG. 2 is a very schematic section view of such a free-wheel diode integrated on the same chip as a VDMOS and transistors forming a control circuit.

As shown on FIG. 2, this technology uses a substrate comprising an N+-type lower layer 10 and an N-type layer 11. In the N-type layer 11 are formed numerous cells of the power MOS transistor, one of which is schematically shown and referenced 12. Each cell of the power transistor comprises P diffusion areas 13 wherein N areas 14 are diffused. A source metallization 15 contacts the areas 14 and the P area 13 which separates them. A gate metallization (polysilicon) 16 permits opening of the channels in the lateral portions of the P areas so that a conduction path is established between the source electrode 15 and a drain metallization 17 formed on the rear surface of the component.

There are also in this structure one or several P-type well(s) 20 wherein are formed MOS transistors 21 permitting a control circuit to be made.

A conventional method for realizing a monolithic free-wheel diode consists in carrying out in a P-type well 30, analogous to the wells 20 comprising the control circuits, an N+ diffusion 31 and a P+ contact 32, associated with metallizations 33 and 34, respectively. Metallization 33 is connected to the source metallization 15 and to the first load terminal and metallization 34 is connected to the other load terminal and to the negative terminal of the supply source 3, the positive terminal of which is connected to drain D.

The equivalent circuit diagram of FIG. 2 is illustrated in FIG. 3, wherein load 2, current source 3 and power transistor 12 are shown again. The N+ junction P between areas 31 and 32 corresponds to the emitter-base junction of a NPN-type parasitic bipolar transistor 35, the collector of which corresponds to layers 11 and 10 of FIG. 2 and is consequently connected to the drain D of the power transistor 12. As a result, during the free-wheel diode operation, a substantial power dissipation occurs in that parasitic transistor 35 and the parasitic currents may impair the control circuits. The conventional methods for reducing the gain of this parasitic bipolar transistor are inadequate due to the high current liable to flow through the load.

To palliate this drawback, it has been devised in prior art to realize structures of the "active diode" type, that is, controlled structures, selectively conductive or non-conductive according to the polarity of the voltage across their terminals.

Such an active diode structure is illustrated on FIG. 4. It comprises the same components labelled with the same references as those of FIG. 3 with the addition of a MOS transistor 40 in parallel with load 2 controlled in opposition with respect to power transistor 12. Thus, this transistor 40 is blocked when transistor 12 is conductive, and conductive when transistor 12 is blocked.

This method seems a prori satisfactory; however, in the structures of the above described type, there remains a parasitic bipolar transistor 35. Indeed, transistor 40 is for example made in the way illustrated in FIG. 5: it is formed in a well 41 analogous to well 30 of FIG. 2 and comprises a drain area 42 and a source area 43 connected by a metallization to a P+-type overdoped area 44 establishing a contact with well 41. A gate is provided between the drain and source regions. Load 2 is connected between the metallizations of drain 45 and of source 46. As in FIG. 2, the drain metallization 45 will be connected to the source 15 of the power transistor. However, as shown in FIG. 4, there remains a parasitic transistor 35, the emitter of which corresponds to region 42, the base to the well 41 and the collector to the power transistor drain. Normally, this parasitic bipolar transistor 35 is inactive when MOS transistor 40 is conductive (during the free-wheel operation). However, to enable transistor 35 to remain blocked, the voltage drop across the terminals of transistor 40 has to be lower than the emitter/base voltage drop of a bipolar transistor, that is, about 0.7 volt. This implies a low resistor at the conductive state of the MOS transistor 40 and therefore a substantial surface thereof, which one tries to avoid in the realization of a component.

Thus, the two solutions of the prior art, respectively shown in FIGS. 2 and 5, cause the presence of a parasitic bipolar transistor, the effects of which are damaging except, in case of FIGS. 4 and 5, if one chooses to lose a large silicon surface.

Moreover, in both cases according to the above mentioned prior art, during the free-wheeling operation, it is not possible to rapidly dampen the current, the latter being limited only by the internal resistance of the load which is often very weak. Indeed, even in case of FIGS. 4 and 5, if the resistance of the MOS transistor 40 is increased, this causes conduction of the base/emitter diode of the bipolar transistor 35, and therefore the switching of this transistor into the conductive state.

Lastly, another drawback of those arrangements according to the prior art lies in the fact that, in case of an accidental polarity reversal of the current source (which is a non negligible risk for example in case of a circuit connected to a car battery), the current is not limited in any way and can flow through the free-wheel diode and through the diode existing inherently in parallel on the power transistor 12 (this diode is connected between the metallization of drain 17 and of source 15 which is also in contact with the P-type region 13 (see FIG. 2)).

SUMMARY OF THE INVENTION

The invention provides for a composite MOS transistor with a substrate connection switching.

This composite MOS transistor made on a substrate of the first conductivity type comprises a gate electrode, a first main electrode, a second main electrode and a substrate area, as well as means for connecting to the substrate area the first or second main electrode, whichever has the lowest voltage.

In an embodiment according to the invention, the first and second main electrodes are respectively connected to a first main terminals of first and second auxiliary MOS transistors, the second main terminals of which are connected to the substrate; the gates of the first and second auxiliary transistors are controlled by the output of a voltage comparator, the inputs of which are connected to the main electrodes of said composite transistor; whereby, the main electrode of said composite transistor which is at the lowest voltage is automatically connected to the substrate.

This transistor is liable of numerous applications which will be apparent to those skilled in the art. One of those applications is the use of such a transistor as an active diode replacing the MOS transistor 40 described in relation with FIGS. 4 and 5. Then, the three above mentioned drawbacks of the devices according to the prior art are avoided.

BRIEF DISCLOSURE OF THE DRAWINGS

The foregoing and other objects, features and advantages of the invention will be apparent from the following detailed description of preferred embodiments as illustrated in the accompanying drawings wherein FIGS. 1-5, illustrating the prior art, have been described hereinabove;

Generally speaking, as conventional in the field of the integrated circuit representation, it will be noted that the various drawings are not drawn to scale either inside one figure or from one figure to the other, and in particular the thicknesses of the various layers are arbitrarily drawn in order to facilitate the legibility of the drawings.

Figure 6:
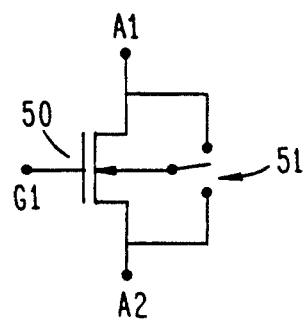
FIG. 6 shows in the form of a circuit diagram the general aspect of the composite MOS transistor according to the invention.

As shown in FIG. 6, the invention relates to a composite MOS transistor comprising main terminals A1 and A2 (which will alternately correspond to a source and a drain function) and a gate G1. This composite MOS transistor comprises a main MOS transistor 50 and switching means 51 for connecting its substrate (that is, the layer in which are formed its source and its drain and in a portion of which is formed under the gate influence a channel region) to either of its terminals A1 and A2 and, more precisely, to the terminal which has the lowest voltage.

Figure 7A:
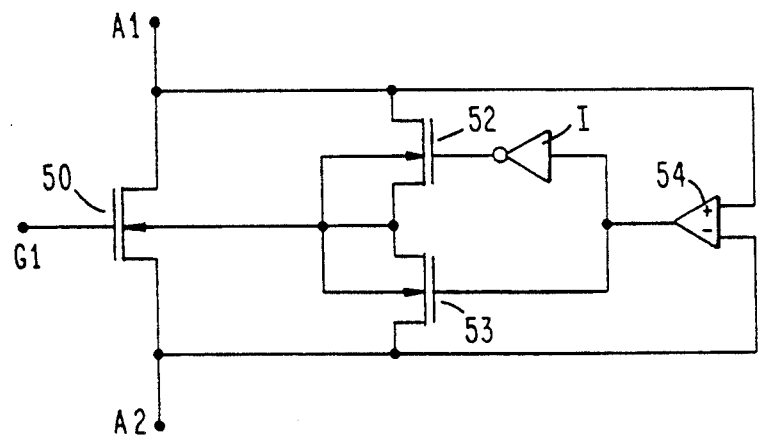
FIGS. 7A and 7B are more detailed circuit drawings showing a composite MOS transistor according to the invention.

FIG. 7A shows an embodiment of the switching device 51. The substrate terminal of the main MOS transistor 50 is connected to the substrate terminals and to the first main terminals of the auxiliary MOS transistors 52 and 53, the other main terminals of which are respectively connected to terminals A1 and A2. The gates of auxiliary transistors 52 and 53 are controlled by the output of a comparator 54, directly as regards MOS transistor 53, and through an inverter I as regards transistor 52. Comparator 54 compares the voltages across terminals A1 and A2. Thus, automatically, the substrate terminal 51 is connected to the terminal A1 or A2 which has the lowest voltage.

Figure 7B:
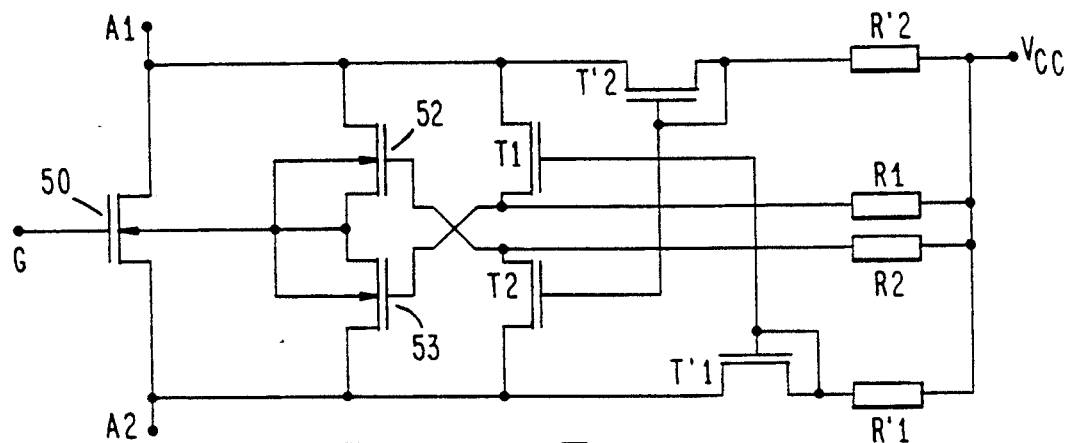

FIG. 7B shows an embodiment of the inverter-comparator set drawn in the form of blocks in FIG. 7A. This FIG. 7B again shows the main transistor 50 and the auxiliary transistors 52 and 53. The gate of transistor 52 is connected to the drain of a transistor T2, the source of which is connected to terminal A2. Similarly, the gate of transistor 53 is connected to the drain of a transistor T1, the source of which is connected to terminal A1. Besides, the gate of transistor T2 is connected to the gate of transistor T'2, the source of which is connected to terminal A1 and the drain to its gate and to the supply terminal Vcc (for example 10 volts) through a resistor R'2. Similarly, the gate of transistor T1 is connected to the gate of a transistor T'1, the source of which is connected to terminal A2 and the drain to its gate and to terminal Vcc through a resistor R'1. Lastly, the gate terminal of transistor 52 and the drain terminal of transistor T2 are connected to terminal Vcc through a resistor R2 and the common terminal of gate of transistor 53 and of the drain of transistor T1 is connected to terminal Vcc through a resistor R1. Transistors T1, T'1, T2, T'2, 52, 53 and 50 have the same substrate.

This circuit operates as follows:

Resistor R'1 injects a current $(Vcc-VT)/R'1$ into transistor T'1. The drain of transistor T'1 is therefore biased at $+VT$ (threshold voltage of a MOS transistor). The voltage on the gate of transistor T1 is then also biased at $+VT$.

If the voltage on terminal A1 is positive with respect to the voltage on terminal A2, the source of transistor T1 is then positive. The gate/source voltage of transistor T1 is therefore lower than VT and this transistor T1 is blocked. The gate of transistor 53 is then connected to terminal Vcc through resistor R1, which causes this transistor 53 to become conductive. Resistor R'2 injects a current $(Vcc-VT)/R'2$ into transistor T'2, the gate of which is biased at a threshold voltage VT above terminal A1 which is positive with respect to terminal A2; the gate/source voltage of transistor T2 is then higher than VT; therefore, transistor T2 is conductive and transistor 52 is blocked. As a result, the substrate of transistor 50 is connected to terminal A2, which is the desired objective.

If the voltage on terminal A1 is lower than the voltage on terminal A2, the source of transistor T1 is negative. The gate/source voltage of this transistor T1 is therefore higher than the threshold voltage of a MOS transistor (VT) and this transistor is conductive. The gate of transistor 53 is therefore connected to terminal A1 through transistor T1 and this transistor is blocked. The substrate of transistor 50 is therefore no longer grounded but is connected to terminal A1 since in that case, as desired, transistor 52 is conductive.

Figure 8:
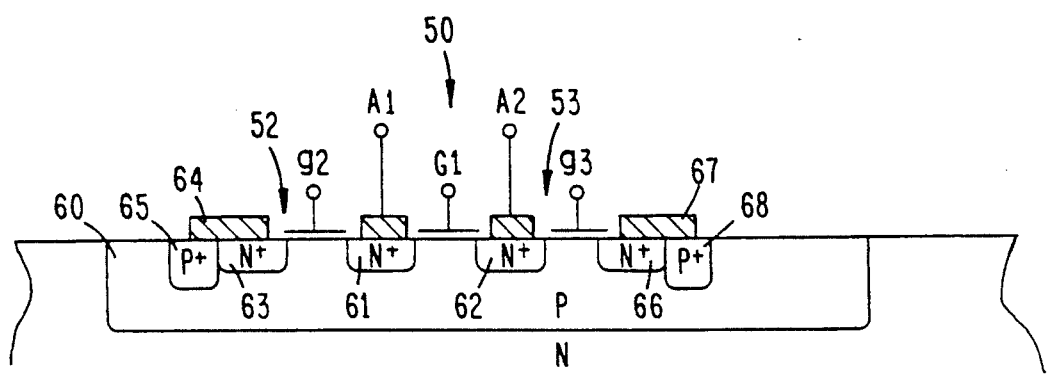
FIG. 8 is a section view of a semiconductive layer illustrating a schematic embodiment of a composite MOS transistor according to the invention.

FIG. 8 is a schematic sectional view of an exemplary embodiment of the structure shown in the form of a circuit diagram in FIG. 7A. This section view shows a P well 60 constituting the substrate of the MOS transistor 50. Conventionally, this transistor 50 comprises in well 60 two N-type regions 61 and 62 corresponding to electrodes A1 and A2 that are liable to be put in conductive state through a gate G1. The first main region 61 also constitutes the first main region of the first auxiliary transistor 52, the second main region 63 of which is connected by means of a metallization 64 to a P-type overdoped area realizing a shorting with the substrate. Similarly, the second auxiliary transistor 53 has its first main region corresponding to diffusion 62 and its second main region 66 is connected by a metallization 67 to a substrate contact 68.

Gates g1 and g2 of the auxiliary MOS transistors 52 and 53 are connected to inverting and amplifying components such as illustrated in FIG. 7B and which can be realized in the same well 60 as the remaining portion of the structure.

Figure 9:
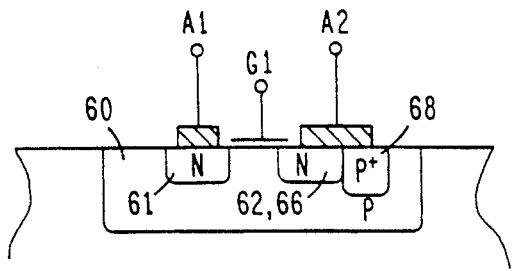
FIGS. 9 and 10 are equivalent and simplified section views of FIG. 8 according to the polarization applied to the composite MOS transistor according to the invention.

Thus, when the voltage on terminal A1 is higher than the voltage on terminal A2, the section view shown in FIG. 8 becomes equivalent to that illustrated in FIG. 9 since gate g3 functions so as to establish a conduction between areas 62 and 66 while areas 61 and 63 are isolated. According to this configuration, terminal A2 is connected to the voltage of the well (substrate).

Figure 10:
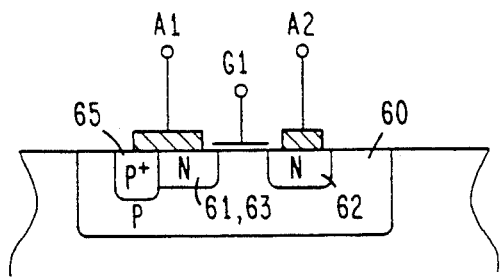

FIG. 10 shows the case the voltage on terminal A1 is on the contrary lower than voltage A2; terminal A1 is then at the voltage of the well.

Figure 4:
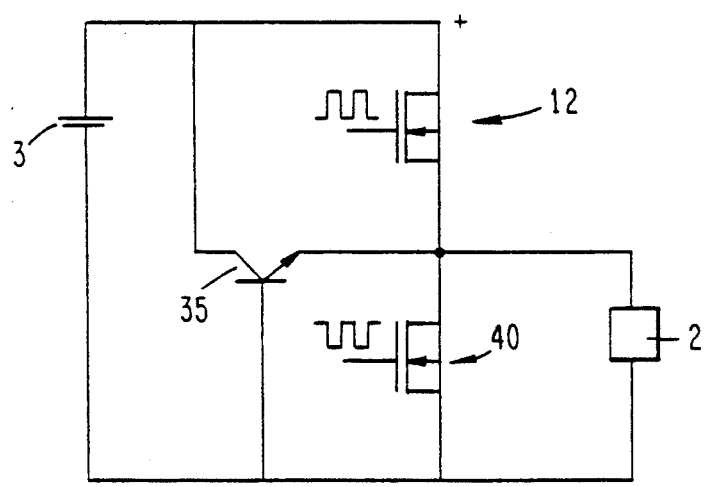
Figure 11:
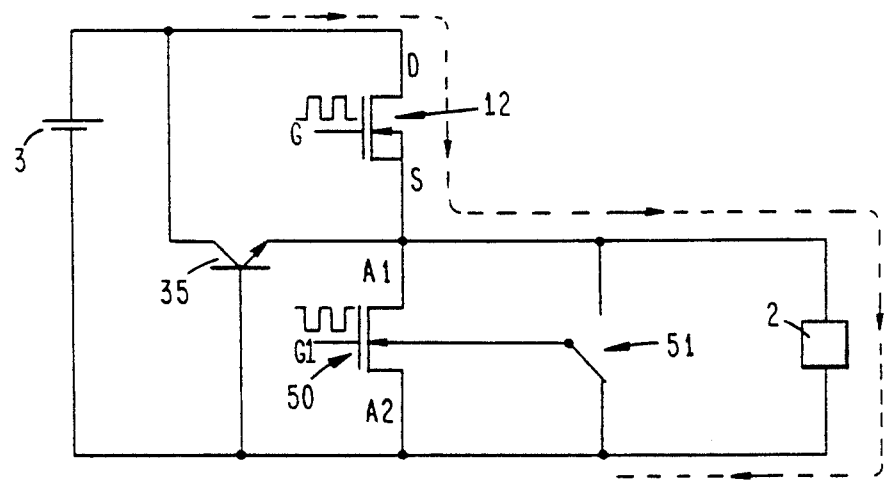
FIGS. 11 and 12 are drawings of a circuit illustrating the use of a composite MOS transistor according to the invention in a free-wheel diode application.
Figure 12:
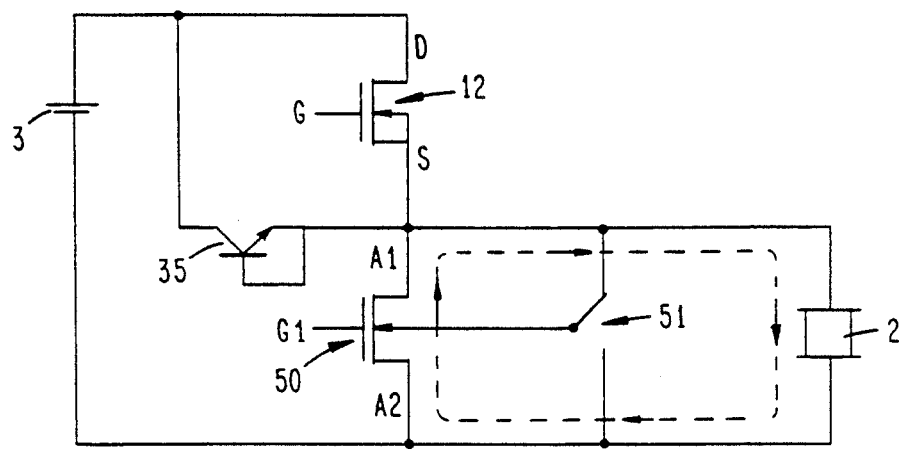

FIGS. 11 and 12 show an application of the composite transistor according to the invention as an active free-wheel diode replacing the MOS transistor 40 used as an active free-wheel diode in FIG. 4. The components common to FIGS. 11 and 12 are labelled with the same references.

Figure 5:
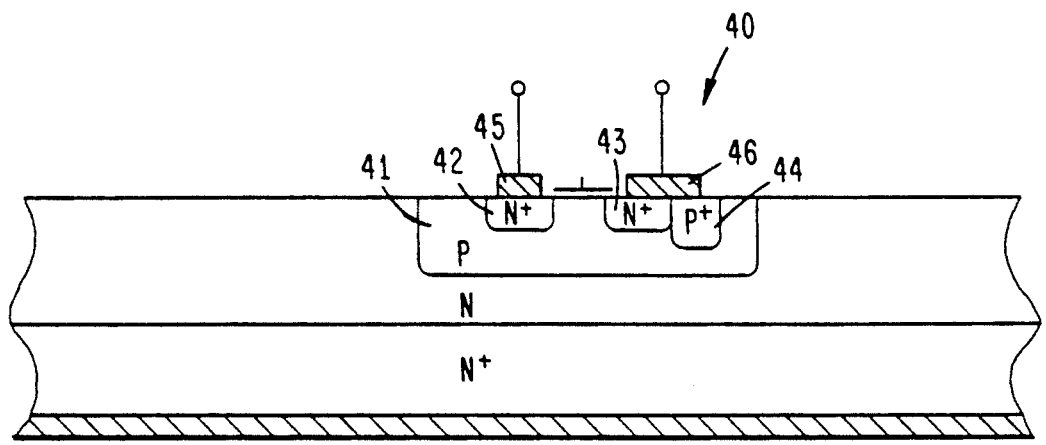

FIG. 11 shows the case the power MOS transistor 12 is conductive and the MOS transistor 50 is blocked. In that case, as shown by dotted lines, the current flows from the current source through the power MOS transistor 12 to load 2. The voltage on terminal A1 is higher than the voltage on terminal A2; terminal A2 is therefore connected to the substrate (well). In this configuration, as in the case of FIG. 4, there is a parasitic transistor 35. The emitter of the parasitic transistor corresponds to region 61 (terminal A1), its base to well 60 and its collector to the drain of the power transistor. In this case, as in case of FIGS. 4 and 5, this transistor 35 has no impairing effect since its base/emitter junction is reverse biased.

FIG. 12 shows the structure in case the power transistor 12 is blocked and transistor 51 is conductive. In that case, the voltage on terminal A1 is lower than the voltage on terminal A2. Terminal A1 is therefore connected to substrate 60 of transistor 50 (see FIG. 10). Consequently, the parasitic transistor 35 has its emitter connected to its base, that is, it no longer has a transistor function and is equivalent to a simple conductive diode from terminal A1 towards the positive supply terminal, that is, a diode in parallel on the normal reverse diode of the power transistor.

Owing to the invention, even if the voltage drop across the terminals of the MOS transistor 50 is non-negligible, no parasitic effects can occur. This is an advantage because it is then possible to have the free-wheel current rapidly decreased by increasing the resistance of transistor 51 by acting on its gate or by positioning a resistor in series with the transistor, which would have been impossible in the case of configurations illustrated in FIGS. 3 and 5 because the parasitic bipolar transistor 35 would have become conductive and would have impaired the system operation. It is therefore possible to use a transistor 50 with a very small surface having a substantially high resistance value at the conductive state.

Figure 3:
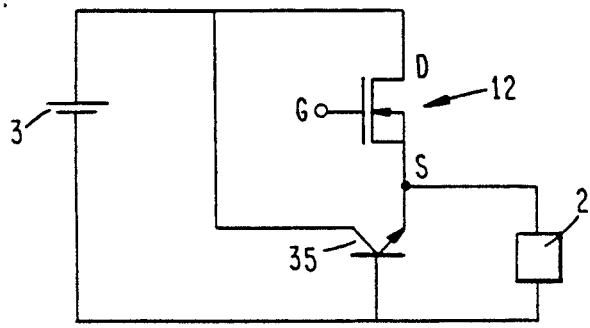

Another advantage of the active diode according to the invention is that, in the cases illustrated in FIGS. 3 and 4, if there is a polarity reversal of the current source 3, a very high reverse current will flow through the active diode and the source/drain parallel diode of the power MOS transistor, and/or in the parasitic bipolar transistor. It is not possible to block this reverse current since, unavoidably, the parasitic bipolar transistor would start operating, which may cause the destruction of the component. However, according to the invention, in the case of polarity reversal, it is possible to block transistor 50 and no parasitic bipolar transistor will interfere.

Of course, the invention is liable of numerous variants and modifications which will be apparent to those skilled in the art. Especially, a specific circuit for the control of transistor 50 has been described as part of the composite MOS transistor according to the invention. Those skilled in the art will notice that components other than a comparator and an inverter are usable.

Besides, when it is desired to block transistor 50 according to the invention, in order to stop the current in the free-wheel, if transistor 50 operates in an all or nothing mode, it is possible to provide for a threshold diode in parallel on this transistor.

Figure 1:
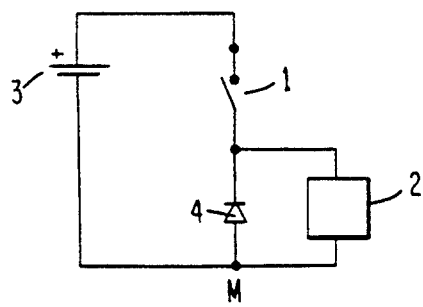
Figure 2:
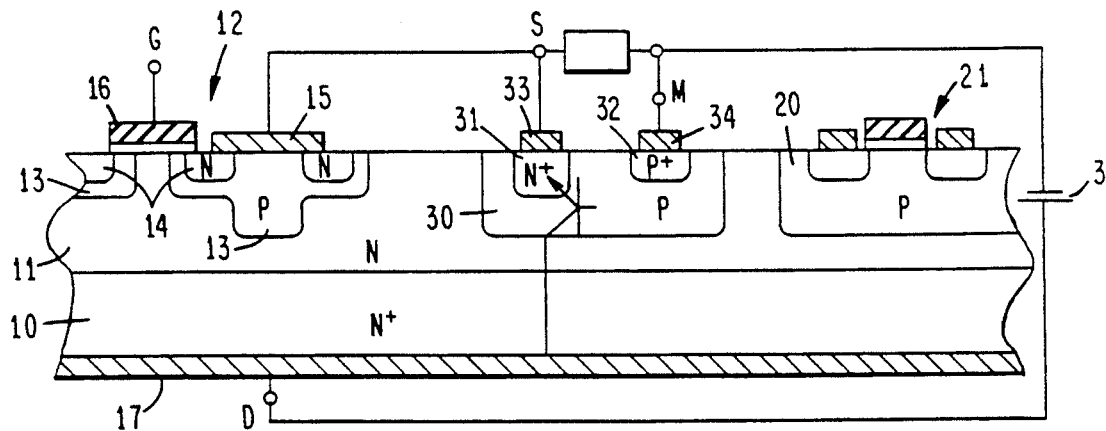

Moreover, it will be noted that the presence of a parasitic bipolar transistor, such as transistor 35 hereinabove described, is not specific to the technology of power MOS transistors disclosed in relation with FIG. 2, namely, a vertical diffused MOS transistor technology. The same problem is encountered in other structures, for example in structures called semi-vertical MOS transistor, wherein the N+ area instead of constituting the rear surface of a component constitutes a pocket including the power transistor area, this pocket being in turn formed in a P-type area.

Lastly, in the above description, one has considered the case all the MOS transistors were N-channel enhanced MOS transistors. The invention is also usable in case some or all the MOS transistors are of different types, by adequately modifying the applied polarities.

I claim:

1. An integrated circuit comprising, a substrate area of a first conductivity type, a composite MOS transistor on the substrate area, the transistor including first and second main electrode regions of the second conductivity type, one of said regions selectively being at a lower potential than the other of said regions as a function of conditions of elements of the integrated circuit connected to the composite transistor, and means for connecting the region having the lowest potential at any particular time to the substrate area via a relatively low impedance path while providing a relatively high impedance path between the other region and the substrate area.

2. The circuit of claim 1 further including a voltage comparator having inputs connected to be responsive to voltages at the main electrodes of said composite transistor, the first and second main electrode regions of said composite MOS transistor being respectively connected to a first main terminal of each first and second auxiliary MOS transistors having second main terminals connected to the substrate area, said first and second auxiliary transistors having gates controlled by an output of the comparator.

3. The circuit of claim 2 wherein said main electrodes correspond to diffusions of the second conductivity type in a well of the first conductivity type, the second main terminals of said auxiliary transistors being connected to diffusions of said first conductivity type and having a high doping level, said diffusions being formed in said substrate area.

4. In combination, a substrate of a first conductivity type, a well in the substrate of a conductivity type opposite to that of the substrate, a free-wheeling monolithic diode formed in the substrate as a vertical power transistor including a composite transistor, the composite transistor including first and second main electrode regions and a substrate area of the second conductivity type, one of said regions selectively being at a lower potential than the other of said regions as a function of conditions of elements of the integrated circuit connected to the composite transistor, and means for connecting the region having the lowest potential at any particular time to the substrate via a relatively low impedance path while providing a relatively high impedance path between the other region and the substrate area, the first main electrode being connected to a source terminal of the power transistor usually connected to a first terminal of an external load, the second main electrode being connected to an access terminal for a second terminal of the load, the gate being controlled in phase opposition to the gate of the power transistor.

5. An integrated circuit comprising a substrate area having a first conductivity type, a composite MOS transistor on the substrate area, said transistor including a gate electrode responsive to a signal source, and first and second main electrode regions of a second conductivity type forming junctions with the substrate area, a single pole, double throw semiconductor switch having segments on the substrate area responsive to the voltage between the first and second main electrode regions, the substrate area forming a first terminal of the switch, the switch providing a low impedance path between the first region and the substrate area in response to the voltage of the first region being less than the voltage of the second region while providing a high impedance path between the second region and the substrate area and providing a low impedance path between the second region to the substrate area in response to the voltage of the second region being less than the voltage of the first region while providing a high impedance path between the first region and the substrate area.

6. The circuit of claim 5 wherein the switch includes second and third MOS transistors in the substrate area, and means responsive to the voltage between the first and second main electrode regions for providing a relatively low impedance source drain path for one of the second and third transistors while a source drain path of the other of the second and third transistors has a relatively high impedance in response to the voltage of the first main electrode region exceeding the voltage of the second main electrode region and vice versa in response to the voltage of the second main electrode region exceeding the voltage of the first main electrode region.

7. An integrated circuit comprising a substrate area having a first conductivity type and including first, second and third MOS transistors; the first transistor including first and second regions having a second conductivity type contacting the substrate area and spaced from each other by a first channel in the substrate area, a first gate electrode between the first and second regions controlling the conductivity of the first channel, first and second ohmic contacts respectively on the first and second regions; the second transistor including the first region as well as third and fourth contacting opposite conductivity type regions contacting the substrate area, the first and third regions being of the same conductivity type and spaced from each other by a second channel in the substrate area, a second gate electrode between the first and third regions controlling the conductivity of the second channel, a third ohmic contact on the third and fourth regions; the third transistor including the second region as well as fifth and sixth contacting opposite conductivity type regions contacting the substrate area, the second and fifth regions being of the same conductivity type and spaced from each other by a third channel in the substrate area, a third gate electrode between the second and fifth regions controlling the conductivity of the third channel, a fourth ohmic contact on the fifth and sixth regions.

8. The circuit of claim 7 wherein the fourth and sixth regions have greater conductivity than the substrate area.

9. The circuit of claim 8 further including means responsive to the relative voltages at the first and second contacts for applying voltages to the second and third gate electrodes so that (a) the second and third channels have relatively low and high impedances in response to the voltage at second contact exceeding the voltage at the first contact to effectively connect the first contact to the substrate area to the exclusion of the second contact and (b) the second and third channels have relatively high and low impedances in response to the voltage at the first contact exceeding the voltage at the second contact to effectively connect the second contact to the substrate area to the exclusion of the first contact.

10. The circuit of claim 7 further including means responsive to the relative voltages at the first and second contacts for applying voltages to the second and third gate electrodes so that (a) the second and third channels have relatively low and high impedances in response to the voltage at second contact exceeding the voltage at the first contact to effectively connect the first contact to the substrate area to the exclusion of the second contact and (b) the second and third channels have relatively high and low impedances in response to the voltage at the first contact exceeding the voltage at the second contact to effectively connect the second contact to the substrate area to the exclusion of the first contact.

* * * * *